US011589609B2

(12) United States Patent
Liu et al.

(10) Patent No.: US 11,589,609 B2
(45) Date of Patent: Feb. 28, 2023

(54) CIRCUIT FOR ULTRASONIC ELECTRONIC CIGARETTE AND ULTRASONIC ELECTRONIC CIGARETTE

(71) Applicant: CHINA TOBACCO HUNAN INDUSTRIAL CO., LTD., Hunan (CN)

(72) Inventors: Jianfu Liu, Hunan (CN); Kejun Zhong, Hunan (CN); Xiaoyi Guo, Hunan (CN); Wei Huang, Hunan (CN); Xinqiang Yin, Hunan (CN); Jianhua Yi, Hunan (CN); Shengbo Li, Hunan (CN); Kaiwei Shen, Hunan (CN)

(73) Assignee: CHINA TOBACCO HUNAN INDUSTRIAL CO, LTD., Hunan (CN)

( * ) Notice: Subject to any disclaimer, the term of this patent is extended or adjusted under 35 U.S.C. 154(b) by 599 days.

(21) Appl. No.: 16/619,418

(22) PCT Filed: Jun. 7, 2018

(86) PCT No.: PCT/CN2018/090229

§ 371 (c)(1),
(2) Date: Dec. 4, 2019

(87) PCT Pub. No.: WO2018/223999

PCT Pub. Date: Dec. 13, 2018

(65) Prior Publication Data

US 2020/0146353 A1 May 14, 2020

(30) Foreign Application Priority Data

Jun. 8, 2017 (CN) ......................... 201710427234.8
Sep. 11, 2017 (CN) ......................... 201710811668.8
Oct. 27, 2017 (CN) ......................... 201721402718.9

(51) Int. Cl.
*A24F 40/05* (2020.01)
*A24F 40/50* (2020.01)
(Continued)

(52) U.S. Cl.
CPC .............. *A24F 40/05* (2020.01); *A24F 40/50* (2020.01); *H03B 1/02* (2013.01); *A24F 40/10* (2020.01)

(58) Field of Classification Search
None
See application file for complete search history.

(56) References Cited

U.S. PATENT DOCUMENTS

2017/0127726 A1* 5/2017 Xiang ..................... A24F 40/60
2017/0273358 A1* 9/2017 Batista .................... A24F 40/60
(Continued)

FOREIGN PATENT DOCUMENTS

CN 206137198 U 5/2017
CN 206949539 U 2/2018
(Continued)

OTHER PUBLICATIONS

International Search Report issued in International Application No. PCT/CN2018/090229 dated Aug. 13, 2018, 2 pages.

*Primary Examiner* — James Harvey
(74) *Attorney, Agent, or Firm* — Mauriel Kapouytian Woods LLP; Liang Huang; Michael Mauriel

(57) ABSTRACT

A circuit for an ultrasonic electronic cigarette and the ultrasonic electronic cigarette are disclosed. The ultrasonic electronic cigarette includes an ultrasonic atomization sheet, a control circuit, a first drive oscillation circuit, a second drive oscillation circuit, and a power circuit. The control circuit is electrically connected to a first end of the ultrasonic atomization sheet through the first drive oscillation circuit, and the control circuit is electrically connected to a second
(Continued)

end of the ultrasonic atomization sheet through the second drive oscillation circuit. The circuit for the ultrasonic electronic cigarette further includes a detection circuit. An output end of the detection circuit is electrically connected to the control circuit. And a detection end of the detection circuit is connected between the ultrasonic atomization sheet and the first drive oscillation circuit, or between the ultrasonic atomization sheet and the second drive oscillation circuit.

20 Claims, 11 Drawing Sheets

(51) Int. Cl.
*H03B 1/02* (2006.01)
*A24F 40/10* (2020.01)

(56) References Cited

U.S. PATENT DOCUMENTS

2017/0360102 A1* 12/2017 Li .......................... A24F 40/465
2020/0146353 A1* 5/2020 Liu .......................... H03B 1/02

FOREIGN PATENT DOCUMENTS

CN 206949540 U 2/2018
CN 207185925 U 4/2018
CN 207383536 U 5/2018

* cited by examiner

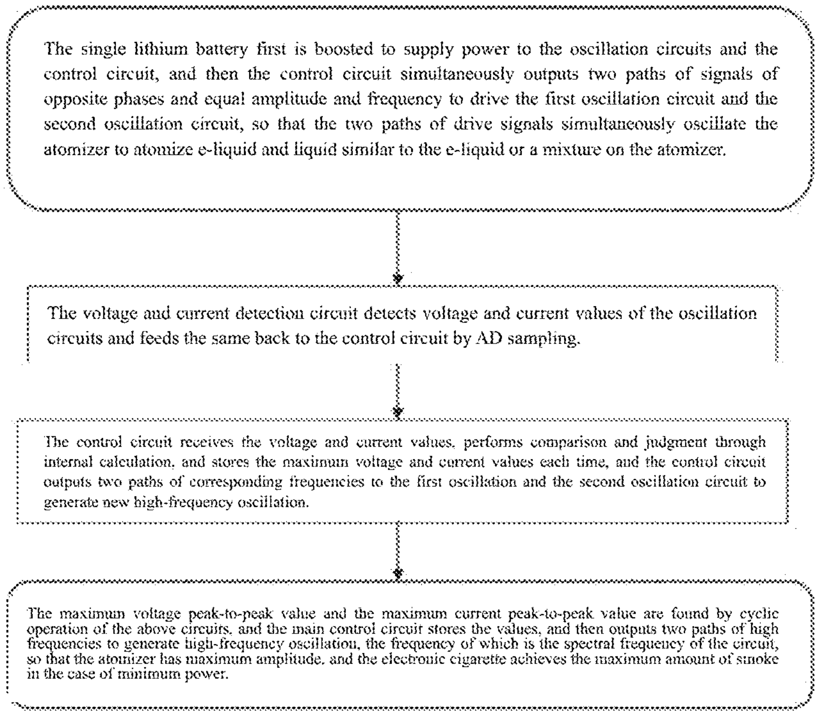

FIG. 9

The single lithium battery first is boosted to supply power to the oscillation circuits and the control circuit, and then the control circuit simultaneously outputs two paths of signals of opposite phases and equal amplitude and frequency to drive the first oscillation circuit and the second oscillation circuit, so that the two paths of drive signals simultaneously oscillate the atomizer to atomize e-liquid and liquid similar to the e-liquid or a mixture on the atomizer.

↓

The voltage and current detection circuit detects voltage and current values of the oscillation circuits and feeds the same back to the control circuit by AD sampling.

↓

The control circuit receives the voltage and current values, perform

CIRCUIT FOR ULTRASONIC ELECTRONIC CIGARETTE AND ULTRASONIC ELECTRONIC CIGARETTE

CROSS REFERENCE TO RELATED APPLICATIONS

This application is a U.S. National Phase application under 35 U.S.C. § 371 of International Application No. PCT/CN2018/090229 filed on Jun. 7, 2018, which claims priority to Chinese Application Number 201710427234.8 filed on Jun. 8, 2017, Chinese Application Number 201710811668.8 filed on Sep. 11, 2017, and Chinese Application Number 201721402718.9 filed on Oct. 27, 2017. The entire contents of these applications are hereby incorporated herein by reference.

FIELD OF THE INVENTION

The present invention belongs to the technical field of electronic cigarettes, and particularly relates to a circuit for ultrasonic electronic cigarette and the ultrasonic electronic cigarette.

BACKGROUND OF THE INVENTION

The circuit for the existing ultrasonic electronic cigarette is only driven by one path, that is, a control circuit is electrically connected to one end of an ultrasonic atomization sheet through a drive circuit and an oscillation circuit in sequence, which leads to the ultrasonic atomization sheet of the ultrasonic electronic cigarette cannot operate at full capacity, and the ultrasonic atomization sheet can only oscillate at half wave with low efficiency, severe heat generation, and fast depletion. At the same time, the power circuit comprises a plurality of lithium batteries, and the operating voltage and the oscillating voltage of different values are respectively provided by different lithium battery packs, so the cost is high and the size is large.

SUMMARY OF THE INVENTION

The existing ultrasonic electronic cigarette is only driven by one path, and thus cannot operate at full capacity, and the ultrasonic atomization sheet can only oscillate at half wave with low efficiency, severe heat generation, and fast depletion. The existing ultrasonic electronic cigarette comprises a plurality of lithium batteries, so that the cost is high and the size is large. For the deficiencies of the prior art, an objective of the present invention is to provide a circuit for an ultrasonic electronic cigarette and the ultrasonic electronic cigarette, in which two ends of an ultrasonic atomization sheet operate at the same time, so that the ultrasonic atomization sheet has high operating efficiency, low heat generation, low energy loss, long service life, low cost and small size.

In order to solve the above technical problems, the technical solution adopted by the present invention is as follows:

A circuit for an ultrasonic electronic cigarette, comprising an ultrasonic atomization sheet, a control circuit, a first drive oscillation circuit and a power circuit, the control circuit being electrically connected to a first end of the ultrasonic atomization sheet through the first drive oscillation circuit, the control circuit and the first drive oscillation circuit being electrically connected to the power circuit, wherein the circuit for the ultrasonic electronic cigarette further comprises a second drive oscillation circuit, the control circuit is electrically connected to a second end of the ultrasonic atomization sheet through the second drive oscillation circuit, and the second drive oscillation circuit is electrically connected to the power circuit.

With the above structure, the power circuit supplies power to the first drive oscillation circuit and the second drive oscillation circuit, and the control circuit controls the first drive oscillation circuit and the second drive oscillation circuit to transmit signals, causing the ultrasonic atomization sheet to atomize e-liquid to generate smoke. Two ends of the ultrasonic atomization sheet operate at the same time, and the ultrasonic atomization sheet is in a resonant state at this time, therefore the operating efficiency of the ultrasonic atomization sheet is greatly improved, and the ultrasonic electronic cigarette emits minimum heat in the case of generating the same amount of smoke, and has lower power consumption and longer service life.

Further, the circuit for the ultrasonic electronic cigarette further comprises a detection circuit for detecting the operating state of the ultrasonic atomization sheet, an output end of the detection circuit is electrically connected to the control circuit, a detection end of the detection circuit is connected between the ultrasonic atomization sheet and the first drive oscillation circuit, or the detection end of the detection circuit is connected between the ultrasonic atomization sheet and the second drive oscillation circuit.

When the ultrasonic electronic cigarette operates, the inherent oscillation frequency of the ultrasonic atomization sheet offsets with the changes of parameters such as pressure, temperature and operating time, so the detection circuit is required to detect the actual operating state of the ultrasonic atomization sheet. The detection circuit sends the detected signals to the control circuit, and the control circuit controls the frequency of the PWM output signals, so that the ultrasonic atomization sheet is always in a resonant state, and the work efficiency and the atomization effect are improved.

Further, the first drive oscillation circuit comprises a first drive circuit and a first oscillation circuit, and the second drive oscillation circuit comprises a second drive circuit and a second oscillation circuit; the control circuit is electrically connected to the first end of the ultrasonic atomization sheet through the first drive circuit and the first oscillation circuit in sequence; the control circuit, the first drive circuit and the first oscillation circuit are all electrically connected to the power circuit, the control circuit is electrically connected to the second end of the ultrasonic atomization sheet through the second drive circuit and the second oscillation circuit in sequence, and the second drive circuit and the second oscillation circuit are both electrically connected to the power circuit.

With the above structure, the power circuit supplies power to the drive circuits and the oscillation circuits, the drive circuits are used for switching and driving the oscillation circuits, and the oscillation circuits cause the ultrasonic atomization sheet to resonate through drive signals provided by the drive circuits. The control circuit causes, through the drive signals simultaneously generated by the first drive circuit and the second drive circuit, the ultrasonic atomization sheet to atomize the e-liquid to generate smoke. Two ends of the ultrasonic atomization sheet operate at the same time, and the ultrasonic atomization sheet is in a resonant state at this time, so that the operating efficiency of the ultrasonic atomization sheet is greatly improved, and the ultrasonic electronic cigarette emits minimum heat in the case of generating the same amount of smoke, and has lower power consumption and longer service life.

Further, the first oscillation circuit comprises a first MOS transistor, a first inductor and a first capacitor, a gate of the first MOS transistor is connected to an output end of the first drive circuit, a source of the first MOS transistor is grounded, the first inductor is connected between the power circuit and a drain of the first MOS transistor, the first capacitor is connected between the drain of the first MOS transistor and the ground, and the drain of the first MOS transistor is electrically connected to the first end of the ultrasonic atomization sheet.

Further, the second oscillation circuit comprises a second MOS transistor, a second inductor and a second capacitor, a gate of the second MOS transistor is connected to an output end of the second drive circuit, a source of the second MOS transistor is grounded, the second inductor is connected between the power circuit and a drain of the second MOS transistor, the second capacitor is connected between the drain of the second MOS transistor and the ground, and the drain of the second MOS transistor is electrically connected to the second end of the ultrasonic atomization sheet.

Further, the first drive circuit and the second drive circuit respectively output drive voltages with opposite phases and equal frequency to the ultrasonic atomization sheet at the same moment under the control of the control circuit.

With the above structure, when the first drive circuit outputs a high level voltage, the second drive circuit outputs a low level voltage with the same frequency; when the first drive circuit outputs a low level voltage, the second drive circuit outputs a high level voltage with the same frequency, with this cycling operations, the operating efficiency of the ultrasonic atomization sheet achieves optimization, and the amount of smoke is maximum.

Further, the power circuit comprises a single lithium battery, a charge-discharge circuit, and boost circuits; the boost circuits comprise a first boost circuit and a second boost circuit, and the single lithium battery is electrically connected to the first boost circuit and the second boost circuit respectively through the charge-discharge circuit; the control circuit, the first drive circuit, and the second drive circuit are all electrically connected to an output end of the first boost circuit; the first oscillation circuit and the second oscillation circuit are both electrically connected to an output end of the second boost circuit.

With the above structure, the single lithium battery can be used to power the entire circuit of the ultrasonic electronic cigarette, so that fewer electronic components are required, resulting in lower cost, higher efficiency and smaller size.

As a first preferred mode, the detection circuit is a voltage-current detection circuit, and an output end of the voltage-current detection circuit is electrically connected to the control circuit; the voltage-current detection circuit is connected between the ultrasonic atomization sheet and the first oscillation circuit, or the voltage-current detection circuit is connected between the ultrasonic atomization sheet and the second oscillation circuit.

With the above structure, the voltage-current detection circuit detects the operating voltage and operating current of the ultrasonic atomization sheet, and feeds back the detected voltage value and current value to the control circuit, and the control circuit can quickly find the resonant frequency of the ultrasonic atomization sheet according to the voltage peak-to-peak value and the current peak-to-peak value, and then controls the operation of the ultrasonic atomization sheet according to the resonant frequency, thereby further improving the operating efficiency of the ultrasonic atomization sheet.

As a second preferred mode, the detection circuit comprises a first antenna electrically connected to one end of the ultrasonic atomization sheet for detecting high-frequency electromagnetic wave signals transmitted when the ultrasonic atomization sheet oscillates, and an antenna receiving circuit for receiving the signals transmitted by the first antenna; the antenna receiving circuit is electrically connected to an input end of the control circuit through a filter amplifier circuit and a filter shaping and square wave conversion circuit in sequence.

The ultrasonic atomization sheet radiates outward electromagnetic waves with same frequency in the state of high-frequency resonance, electromagnetic wave signals are the strongest when the oscillation frequency is closest to the resonant frequency of the ultrasonic atomization sheet, the electromagnetic wave signals radiated can be received by the first antenna and the antenna receiving circuit nearby the ultrasonic atomization sheet, subjected to band-pass filtering and amplification by the filter amplifier circuit, and converted by the filter shaping and square wave conversion circuit into square wave signals that can be identified by the control circuit, then the square wave signals are outputted to the control circuit, and the control circuit adjusts the frequency of the PWM output signals according to the detected frequency of the square wave, so that the frequency of the entire drive oscillation circuit is kept consistent with the offset frequency of the ultrasonic atomization sheet, and the drive oscillation circuit can quickly and accurately generate the same oscillation frequency as the ultrasonic atomization sheet. Therefore, the ultrasonic atomization sheet is always in a resonant state, the atomization effect with high efficiency and stability is maintained to the utmost, the amount of smoke is large, and the product has a long service life. This frequency detection method can eliminate clutter interference of the oscillation circuit, and is more accurate and reliable. Since the propagation time of electromagnetic waves is almost negligible, the purpose of real-time detection and synchronous adjustment of the oscillation frequency can be achieved. Even if the inherent frequency of the ultrasonic atomization sheet is offset due to other factors such as pressure, temperature and service time, the drive oscillation circuit can still adjust the frequency synchronously to achieve frequency tracking.

Further, the antenna receiving circuit comprises a second antenna and a first inductor, a filter amplifier and the second antenna are both electrically connected to a first end of the first inductor, and a second end of the first inductor is grounded.

As a third preferred mode, the detection circuit is a power detection circuit, a detection end of the power detection circuit is electrically connected to one end of the ultrasonic atomization sheet, and an output end of the power detection circuit is electrically connected to the input end of the control circuit.

Since the oscillation frequency is closest to the frequency of the ultrasonic atomization sheet itself when the power of the ultrasonic atomization sheet is maximum, and the amount of smoke of the electronic cigarette is maximum, interferences of other components in the circuit can be eliminated by power detecting method, therefore realize fast and accurate frequency tracking of the ultrasonic atomization sheet more accurately and reliably, thereby ensuring that the amount of smoke of the electronic cigarette is always maximum, improving the performance of the product, prolonging the service cycle of the electronic cigarette, and realizing continuous maximum smoke with low power.

Based on the same inventive concept, the present invention also provides an ultrasonic electronic cigarette, comprising the circuit for the ultrasonic electronic cigarette.

Compared with the prior art, the present invention has the advantages that two ends of the ultrasonic atomization sheet operate at the same time, so that the ultrasonic atomization sheet has high operating efficiency, low heat generation, low energy loss and long service life; the single lithium battery is used to supply power, so the cost is low and the size is small; when the inherent frequency of the ultrasonic atomization sheet offsets due to the changes of parameters such as pressure, temperature and operating time, the changed frequency of the ultrasonic atomized sheet can be quickly and accurately detected and provided to the control circuit, so that the control circuit can adjust the oscillation frequency in time, making the ultrasonic atomization sheet always in a resonant state, and maintaining the atomization effect with high efficiency and stability to the utmost.

BRIEF DESCRIPTION OF THE DRAWINGS

FIG. 9 is a work flow diagram of Embodiment 2.

In which, 1 control circuit, 2 first drive oscillation circuit, 201 first drive circuit, 202 first oscillation circuit, 3 second drive oscillation circuit, 301 second drive circuit, 302 second oscillation circuit, 4 power detection circuit, 5 power circuit, J ultrasonic atomization sheet, 6 filter shaping and square wave conversion circuit, 7 filter amplification circuit, 8 single lithium battery, 9 charge-discharge circuit, 10 first boost circuit, 11 second boost circuit, 12 voltage-current detection circuit, 13 antenna receiving circuit, C1 first capacitor, C2 second capacitor, C3 third capacitor, C4 fourth capacitor, C5 fifth capacitor, C6 sixth capacitor, C7 seventh capacitor, C8 eighth capacitor, C9 ninth capacitor, D1 first diode, D2 second diode, D3 third diode, E1 first antenna, E2 second antenna, L1 first inductor, L2 second inductor, L3 third inductor, Q1 first NPN triode, Q2 second NPN triode, Q3 first MOS transistor, Q4 second MOS transistor, Q5 first PNP triode, Q6 second PNP triode, Q7 third NPN triode, R1 first resistor, R2 second resistor, R3 third resistor, R4 fourth resistor, R5 fifth resistor, R6 sixth resistor, R7 seventh resistor, R8 eighth resistor, R9 ninth resistor, R10 tenth resistor, U1 boost chip, U2 amplifier.

DETAILED DESCRIPTION OF EMBODIMENTS

Embodiment 1

Figure 1:
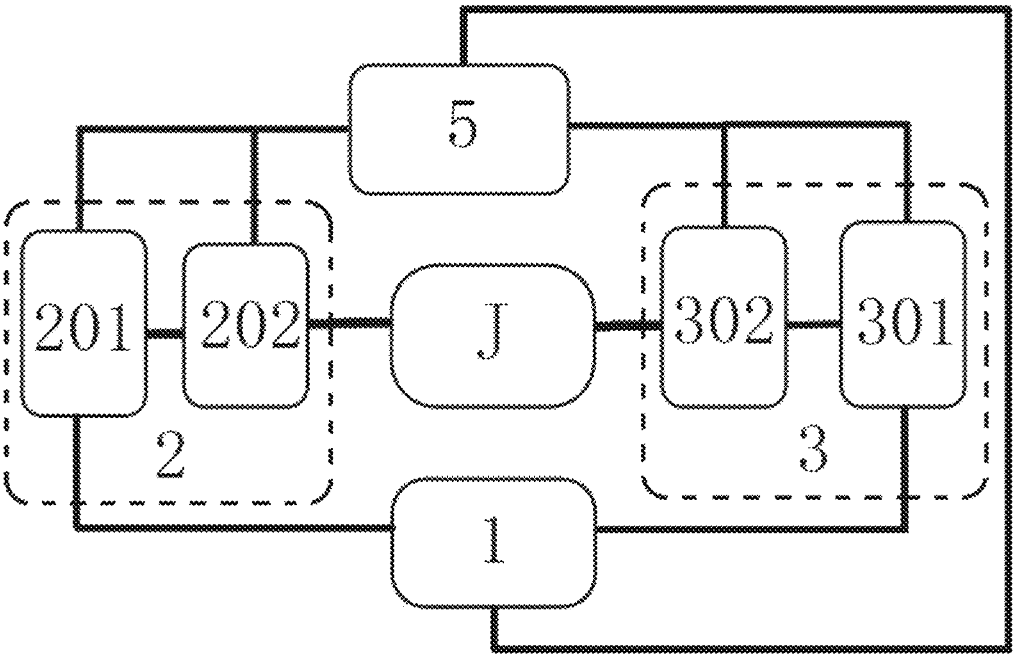
FIG. 1 is a structural schematic diagram of blocks of Embodiment 1 according to the present invention.
Figure 2:
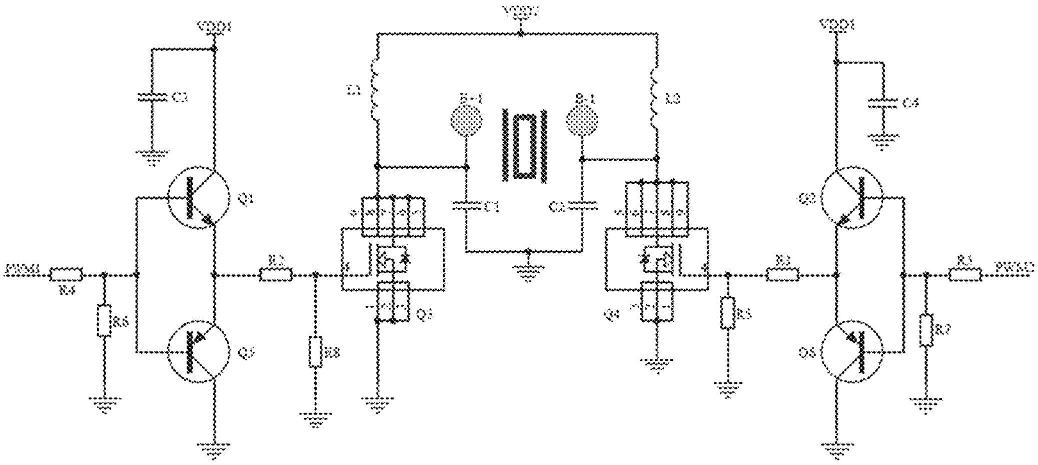
FIG. 2 is a circuit diagram of Embodiment 1.
Figure 3:
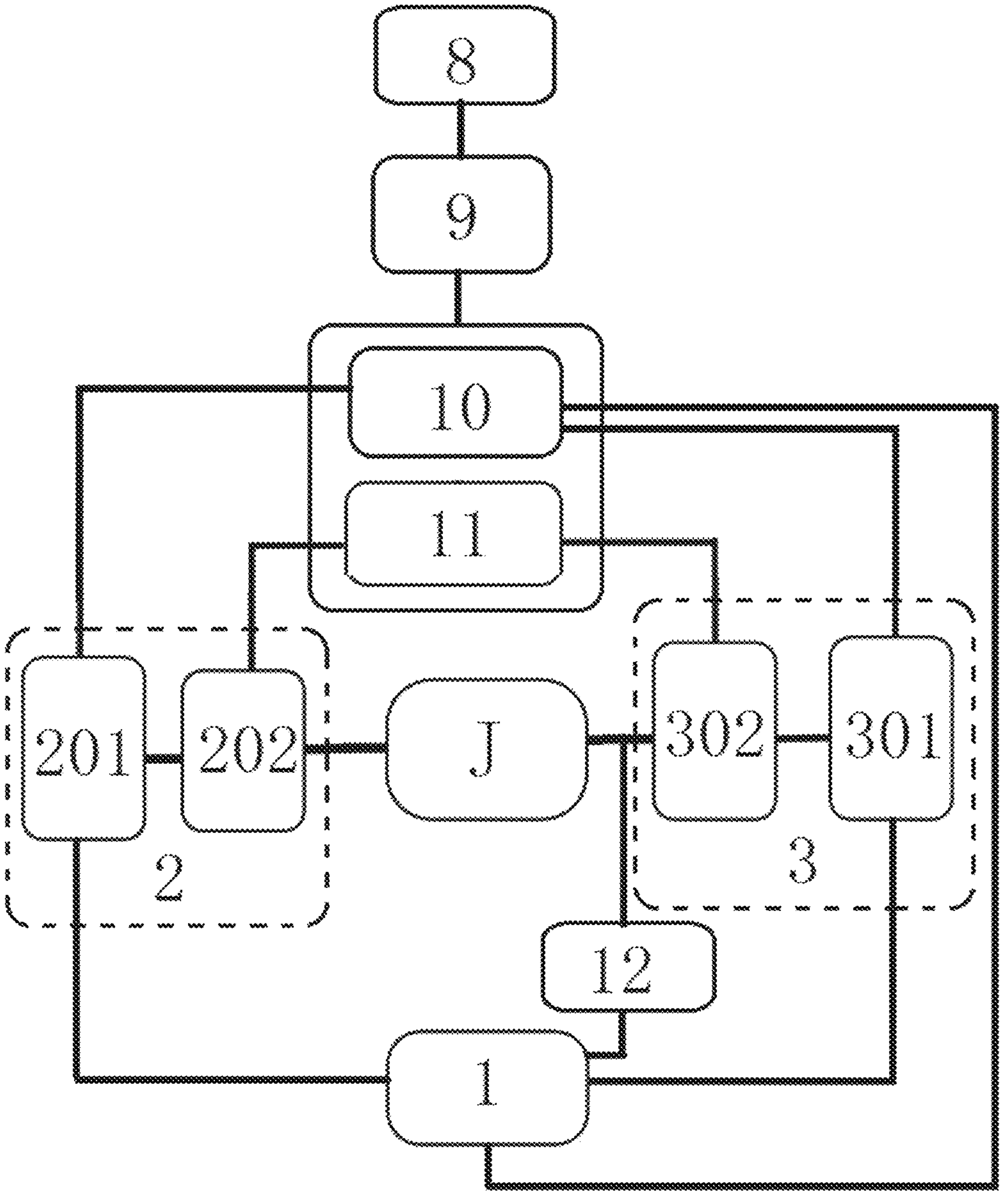
FIG. 3 is a structural schematic diagram of blocks of Embodiment 2 according to the present invention.
Figure 4:
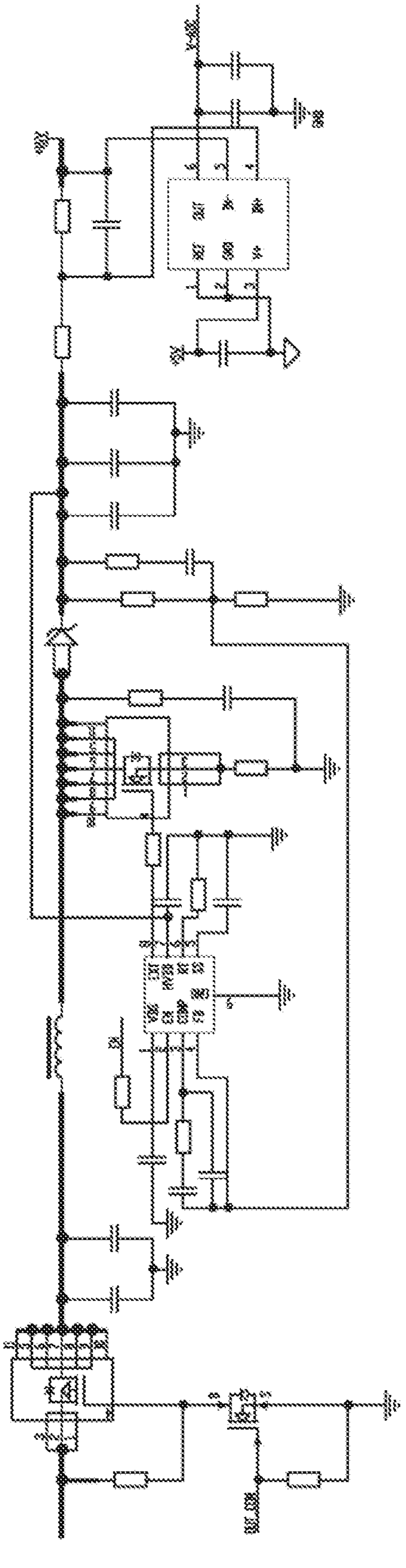
FIG. 4 to FIG. 8 are circuit diagrams of Embodiment 2.
Figure 5:
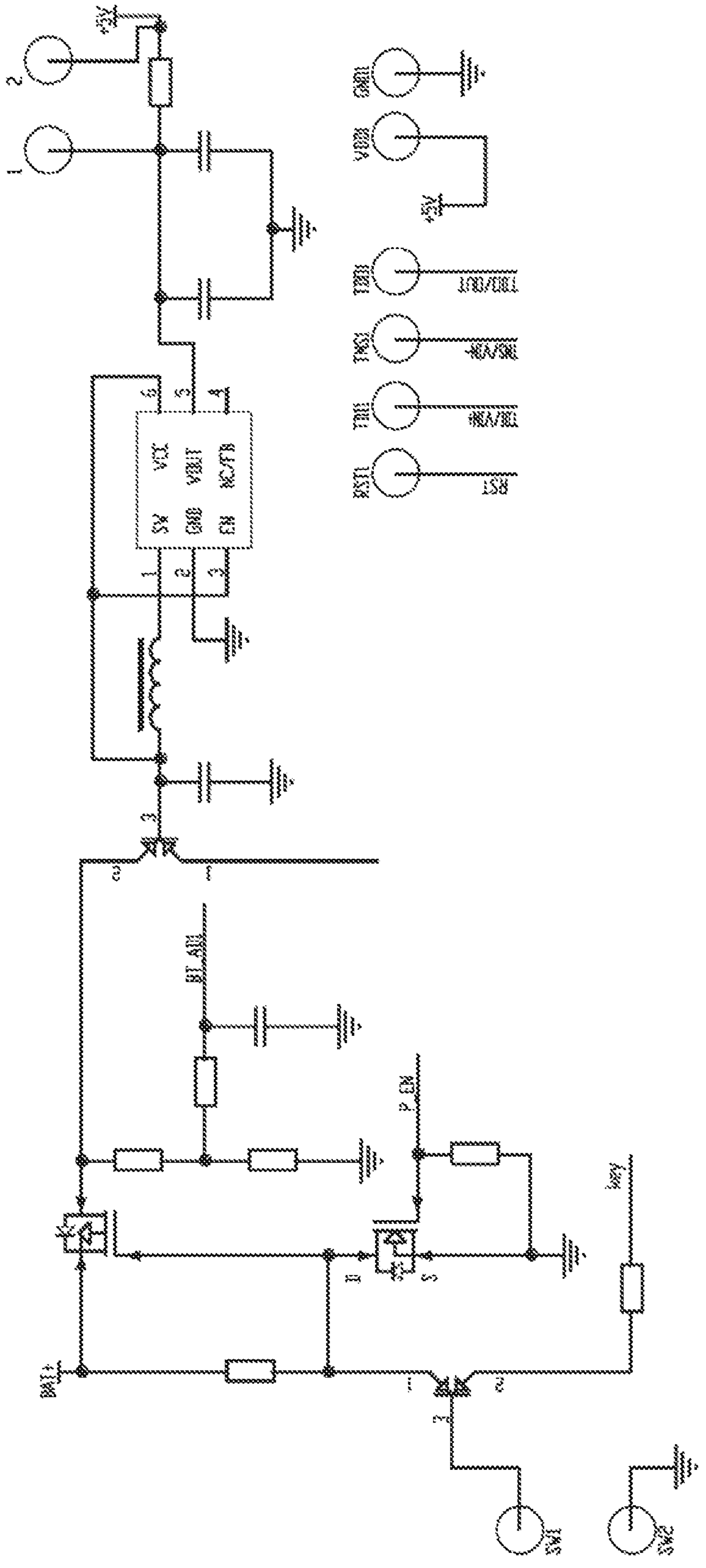
Figure 6:
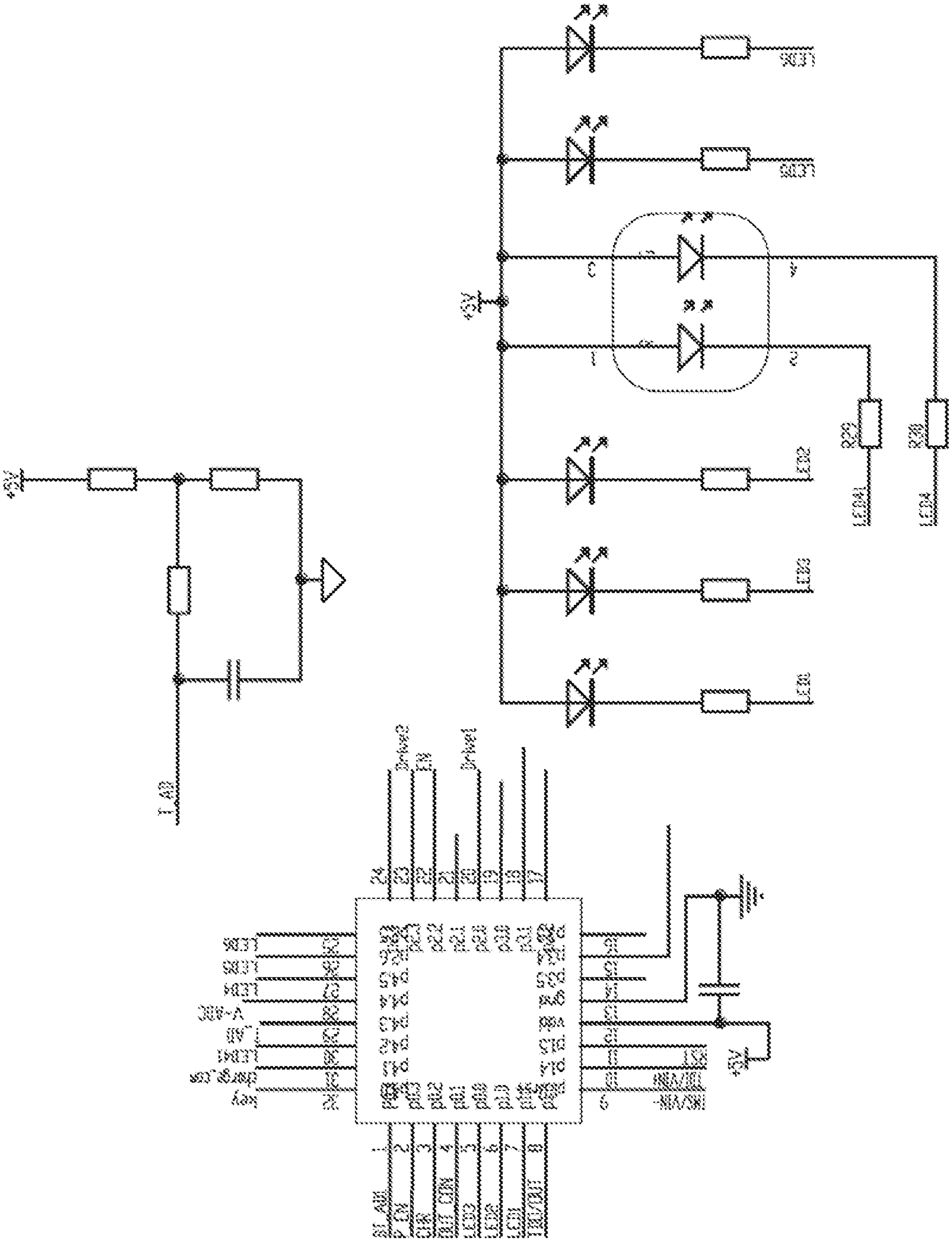
Figure 7:
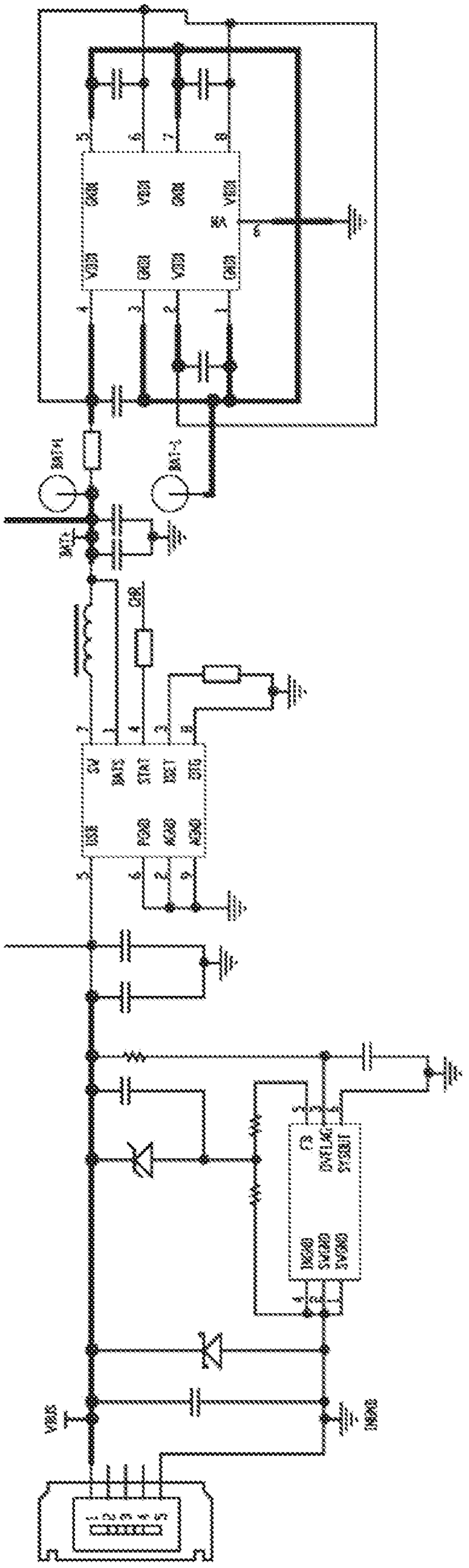
Figure 8:
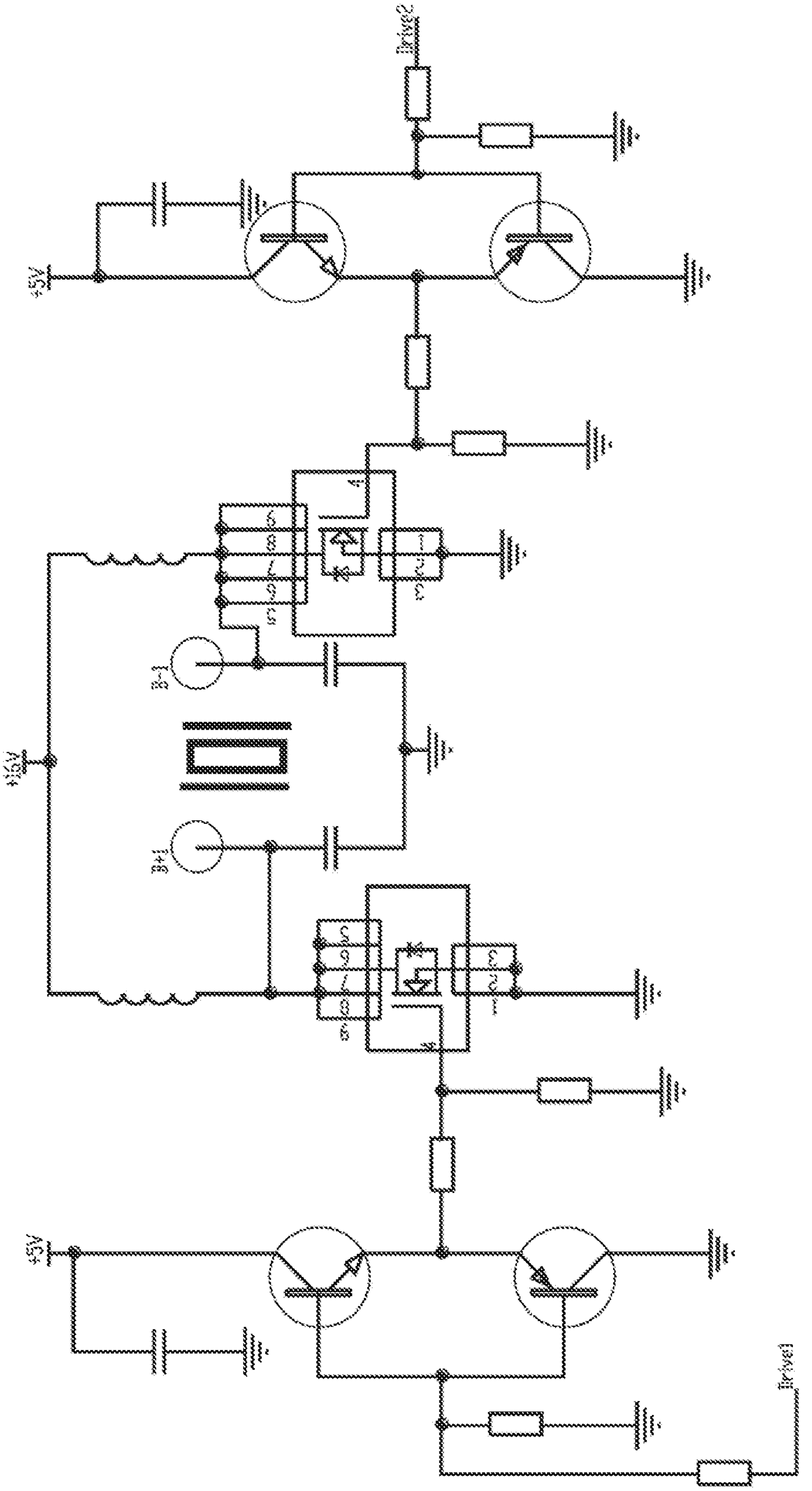

As shown in FIG. 1 and FIG. 2, a circuit for an ultrasonic electronic cigarette comprises an ultrasonic atomization sheet J, a control circuit 1, a first drive oscillation circuit 2 and a power circuit 5, the control circuit 1 is electrically connected to a first end of the ultrasonic atomization sheet J through the first drive oscillation circuit 2, the control circuit 1 and the first drive oscillation circuit 2 are both electrically connected to the power circuit 5, the circuit for the ultrasonic electronic cigarette further comprises a second drive oscillation circuit 3, the control circuit 1 is electrically connected to a second end of the ultrasonic atomization sheet J through the second drive oscillation circuit 3, and the second drive oscillation circuit 3 is electrically connected to the power circuit 5.

The first drive oscillation circuit 2 comprises a first drive circuit 201 and a first oscillation circuit 202, and the second drive oscillation circuit 3 comprises a second drive circuit 301 and a second oscillation circuit 302; the control circuit 1 is electrically connected to the first end of the ultrasonic atomization sheet J through the first drive circuit 201 and the first oscillation circuit 202 in sequence; the control circuit 1, the first drive circuit 201 and the first oscillation circuit 202 are all electrically connected to the power circuit 5, the control circuit 1 is electrically connected to the second end of the ultrasonic atomization sheet J through the second drive circuit 301 and the second oscillation circuit 302 in sequence, and the second drive circuit 301 and the second oscillation circuit 302 are both electrically connected to the power circuit 5.

The ultrasonic atomization sheet J is a nonporous piezoelectric ceramic atomization sheet.

The first oscillation circuit 202 comprises a first MOS transistor Q3, a first inductor L1 and a first capacitor C1, a gate of the first MOS transistor Q3 is connected to an output end of the first drive circuit 201, a source of the first MOS transistor Q3 is grounded, the first inductor L1 is connected between the power circuit 5 and a drain of the first MOS transistor Q3, the first capacitor C1 is connected between the drain of the first MOS transistor Q3 and the ground, and the drain of the first MOS transistor Q3 is electrically connected to the first end of the ultrasonic atomization sheet J.

The second oscillation circuit 302 comprises a second MOS transistor Q4, a second inductor L2 and a second capacitor C2, a gate of the second MOS transistor Q4 is connected to an output end of the second drive circuit 301, a source of the second MOS transistor Q4 is grounded, the second inductor L2 is connected between the power circuit 5 and a drain of the second MOS transistor Q4, the second capacitor C2 is connected between the drain of the second MOS transistor Q4 and the ground, and the drain of the second MOS transistor Q4 is electrically connected to the second end of the ultrasonic atomization sheet J.

The first drive circuit 201 and the second drive circuit 301 respectively output drive voltages with opposite phases and equal frequency to the ultrasonic atomization sheet J at the same moment under the control of the control circuit 1.

A first resistor R1 is connected between the second drive circuit 301 and the second oscillation circuit 302, a second resistor R2 is connected between the first drive circuit 201 and the first oscillation circuit 202, a third resistor R3 is connected between the second drive circuit 301 and the control circuit 1, and a fourth resistor R4 is connected between the first drive circuit 201 and the control circuit 1.

The first resistor R1, the second resistor R2, the third resistor R3, and the fourth resistor R4 play a role in limiting current to prevent the ultrasonic atomization sheet J from being short-circuited and burn out the front-end circuit.

The first drive circuit 201 comprises a first NPN triode Q1, a first PNP triode Q5 and a third capacitor C3, a base of the first NPN triode Q1 and a base of the first PNP triode Q5 are both controlled to the control circuit 1, an emitter of the first NPN triode Q1 and an emitter of the first PNP triode Q5 are both connected to the first oscillation circuit 202, a collector of the first NPN triode Q1 is connected to the power circuit 5 and grounded through the third capacitor C3, and a collector of the first PNP triode Q5 is grounded.

The second drive circuit 301 comprises a second NPN triode Q2, a second PNP triode Q6 and a fourth capacitor C4, a base of the second NPN triode Q2 and a base of the second PNP triode Q6 are both controlled to the control circuit 1, an emitter of the second NPN triode Q2 and an emitter of the second PNP triode Q6 are both connected to the second oscillation circuit 302, a collector of the second NPN triode Q2 is connected to the power circuit 5 and grounded through the fourth capacitor C4, and a collector of the second PNP triode Q6 is grounded.

The first embodiment further comprises a fifth resistor R5, a sixth resistor R6, a seventh resistor R7 and an eighth resistor R8; one end of the fifth resistor R5 is connected between the second drive circuit 301 and the second oscillator circuit 302, and the other end of the fifth resistor R5 is grounded; one end of the sixth resistor R6 is connected between the control circuit 1 and the first drive circuit 201, and the other end of the sixth resistor R6 is grounded; one end of the seventh resistor R7 is connected between the control circuit 1 and the second drive circuit 301, and the other end of the seventh resistor R7 is grounded; one end of the eighth resistor R8 is connected between the first drive circuit 201 and the first oscillation circuit 202, and the other end of the eighth resistor R8 is grounded.

The sixth resistor R6 and the seventh resistor R7 can play a role in increasing the driving capability of low-level voltage.

The operating principle of the first embodiment is as follows:

1. The power circuit 5 provides effective voltage values for the drive circuits and the oscillation circuits respectively. PWM signals (pulse width modulation signals) output by the control circuit 1 was amplified by the drive circuits to drive the MOS transistors (metal oxide field effect transistors) of the oscillation circuits, so that the MOS transistors of the oscillation circuits can be completely turned on or off to achieve the maximum current conduction effect or current cut-off effect, therefore the oscillation circuits can fully resonate under low power voltage, and provide efficient oscillation frequencies and oscillation amplitudes for the piezoelectric ceramic atomization sheet connected thereto, making the oscillating efficiency of the piezoelectric ceramic atomization sheet optimal.

2. The drive circuit is a totem pole linked by a P-type triode and an N-type triode; the drive circuit can be split into a first drive circuit 201 on the left side and a second drive circuit 301 on the right side. By amplifying PWM signals (match the inherent frequency of the ultrasonic atomization sheet J) provided by a single chip microcomputer in the control circuit 1, the first oscillation circuit 202 on the left side and the second oscillation circuit 302 on the right side simultaneously generate high frequency signals with same frequency and opposite phases, the high frequency signals drive the ultrasonic atomization sheet J to oscillate up and down around the axis according to the sine waves, so that the e-liquid, liquid or a mixture similar to the e-liquid on the ultrasonic atomization sheet J can generate the maximum amount of smoke. When the first drive circuit 201 outputs a high level voltage, the second drive circuit 301 generates a low level voltage with the same frequency and opposite phase; when the first drive circuit 201 outputs a low level voltage, the second drive circuit 301 simultaneously generates a high level voltage with the same frequency and opposite phase, with this cycling operations, the operating efficiency of the ultrasonic atomization sheet J is optimal, the energy loss is minimum, and the maximum amount of smoke is achieved with low power.

3. The oscillation circuits resonate by means of the PWM signals amplified by the drive circuits through the inductors and capacitors connected thereto and the electrostatic capacitance of the ultrasonic atomization sheet J itself to form sine waves, thereby effectively driving the ultrasonic atomization sheet J. As shown in FIG. 2, the frequency of the PWM1 signal is equal to the inherent frequency of the ultrasonic atomization sheet J; when the PWM1 outputs a high level voltage to the first drive circuit 201, the first NPN triode Q1 is turned on, and the first PNP triode Q5 is turned off, a high level voltage VDD1 is outputted accordingly to turn on the first MOS transistor Q3, the first inductor L1 is charged, and the first capacitor C1 is discharged; at the same time, the PWM2 outputs a low level signal that has opposite phase and equal frequency and amplitude with respect to the PWM1 signal to the second drive circuit 301, the second NPN triode Q2 is turned off, the second PNP triode Q6 is turned on, a low level voltage GND is outputted accordingly to turn off the second MOS transistor Q4, the second inductor L2 is discharged, the second capacitor C2 is charged, and the voltage drives the ultrasonic atomization sheet J to oscillate by the second inductor L2 and the first capacitor C1. When the PWM1 outputs a low level voltage to the first drive circuit 201, the first NPN triode Q1 is turned off, the first PNP triode Q5 is turned on, a low level voltage GND is outputted accordingly to turn off the first MOS transistor Q3, the first inductor L1 is discharged, and the first capacitor C1 is charged; at the same time, the PWM2 outputs a high level signal that has opposite phase and equal frequency and amplitude with respect to the PWM1 signal to the second drive circuit 301, the second NPN triode Q2 is turned on, the second PNP triode Q6 is turned off, a high level voltage VDD1 is outputted accordingly to turn on the second MOS transistor Q4, the second inductor L2 is charged, the second capacitor C2 is discharged, and the voltage drives the ultrasonic atomization sheet J to oscillate by the second inductor L2 and the first capacitor C1, with this cycling operations, the ultrasonic atomization sheet J oscillates repeatedly to achieve optimal operating efficiency and minimum energy loss, and the maximum amount of smoke is achieved with low power.

4. The first resistor R1, the second resistor R2, the third resistor R3 and the fourth resistor R4 play a role in limiting current to prevent the atomization sheet from being short-circuited and burn out the front-end circuit, the third capacitor C3 and the fourth capacitor C4 can stabilize the power voltage, and the sixth resistor R6 and the seventh resistor R7 play a role in increasing the driving capability of low-level voltage.

Embodiment 2

As shown in FIG. 3 to FIG. 8, the second embodiment of the present invention is the same as the first embodiment, except that the power circuit 5 comprises a single lithium battery 8, a charge-discharge circuit 9 and boost circuits; the boost circuits comprise a first boost circuit 10 and a second boost circuit 11, and the single lithium battery 8 is electrically connected to the first boost circuit 10 and the second boost circuit 11 respectively through the charge-discharge circuit 9; the control circuit 1, the first drive circuit 201 and the second drive circuit 301 are all electrically connected to an output end of the first boost circuit 10; the first oscillation circuit 202 and the second oscillation circuit 302 are electrically connected to an output end of the second boost circuit 11.

The second embodiment further comprises a voltage-current detection circuit 12, an output end of the voltage-current detection circuit 12 is electrically connected to the control circuit 1, and the voltage-current detection circuit 12 is connected between the ultrasonic atomization sheet J and the second oscillation circuit 302 (the voltage-current detection circuit 12 can also be connected between the ultrasonic atomization sheet J and the first oscillation circuit 202).

The general operating process of the present invention is illustrated in FIG. 9. Power in the second embodiment is provided by the single lithium battery 8 through boosting.

The boost circuits comprise a first boost circuit 10 that boosts the voltage of the single lithium battery 8 to 3.3 V/5 V and a second boost circuit 11 that boosts the voltage of the single lithium battery 8 to about 16 V. The boost circuits employ dedicated BOOST chips. By controlling continuous on-off of external MOS transistors, back-end diodes and electrolytic capacitors are charged, the voltage of the single lithium battery 8 is stably boosted to about 16 V, and an output power of about 30 W and a conversion efficiency of more than 85% are achieved, accompanied by an overcurrent protection circuit to meet the power supply requirements of the back-end ultrasonic atomization circuit. In addition, the voltage of the single lithium battery 8 is boosted to 3.3 V/5 V to supply power to the single chip microcomputer and the drive circuits.

A lithium battery charging chip in the charge-discharge circuit 9 achieves 5V/2 A charging through a USB interface, which has overcharge-overvoltage protection function. The discharge protection circuit protects the power supply to provide the correct voltage for the entire circuit, and prevents overcurrent and short circuit of the back-end circuit from causing damage to the battery.

The control circuit 1 controls the indication of LED lamps and the on-off of the MOS transistors through 51 series single chip microcomputers to realize low power consumption and safety protection of the entire circuit board, AD detection is performed to detect the voltage and current changes of the ultrasonic atomization sheet J in real time so as to prevent dry burning and frequency offset of the ultrasonic atomization sheet J, and provide PWM signals for the back-end drive circuits.

The oscillation circuits drive the back-end oscillation circuits to fully oscillate through the enhancement of the PWM signals by the totem circuits, so that the atomization sheet performs LC full-wave oscillation and the operating efficiency is improved.

The voltage and current detection circuit 12 is connected to a power end of the ultrasonic atomization sheet J for detecting the voltage and current changes during the operation of the ultrasonic atomization sheet J. The load current of the ultrasonic atomization sheet J changes accordingly when the frequency of the ultrasonic atomization sheet J offsets, the voltage-current detection circuit 12 detects the peak-to-peak value of the voltage and the peak-to-peak value of the current on the ultrasonic atomization sheet J to quickly find the resonant frequency of the ultrasonic atomization sheet J, and the frequency of the output PWM wave is timely adjusted according to the detected voltage and current changes to achieve the frequency tracking effect, so that the ultrasonic atomization sheet J maintains high-efficiency full-wave oscillation at all times to achieve the maximum amount of smoke with minimum power consumption.

Embodiment 3

Figure 10:
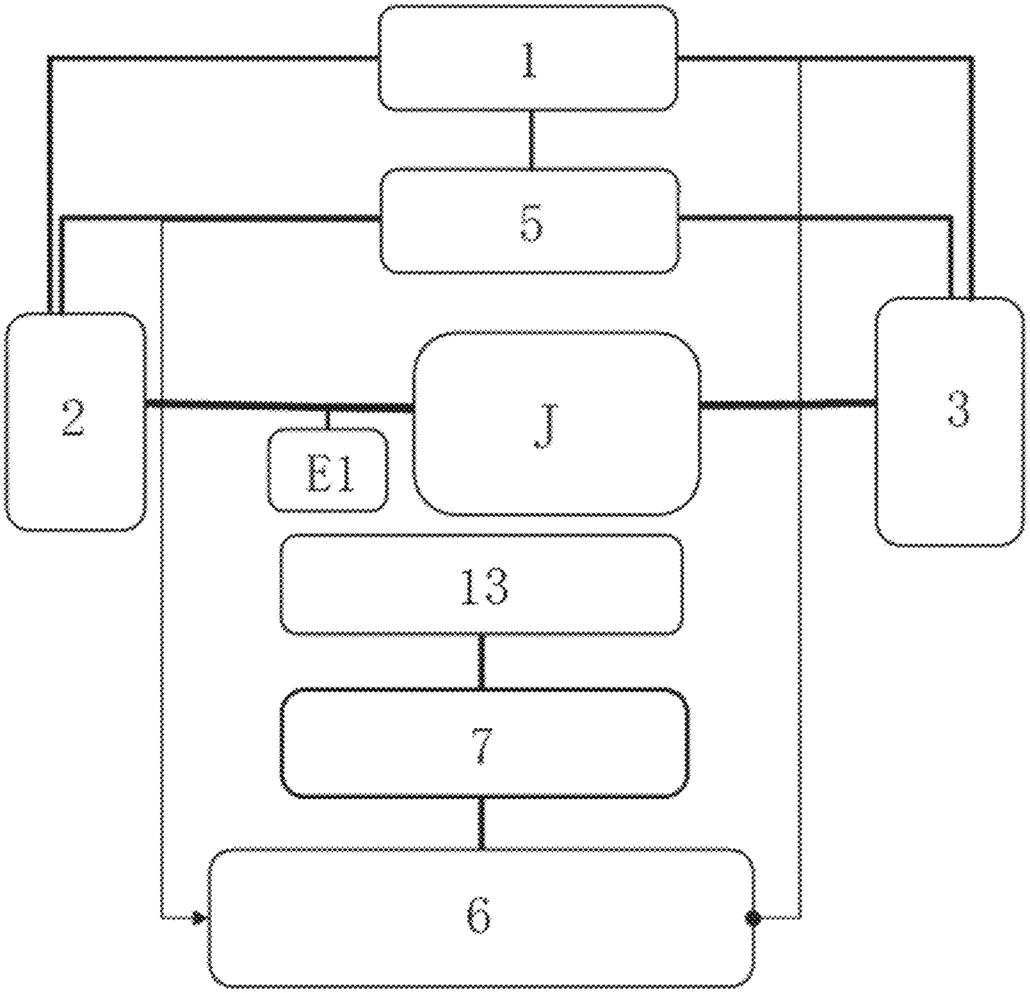
FIG. 10 is a structural schematic diagram of blocks of Embodiment 3 according to the present invention.
Figure 11:
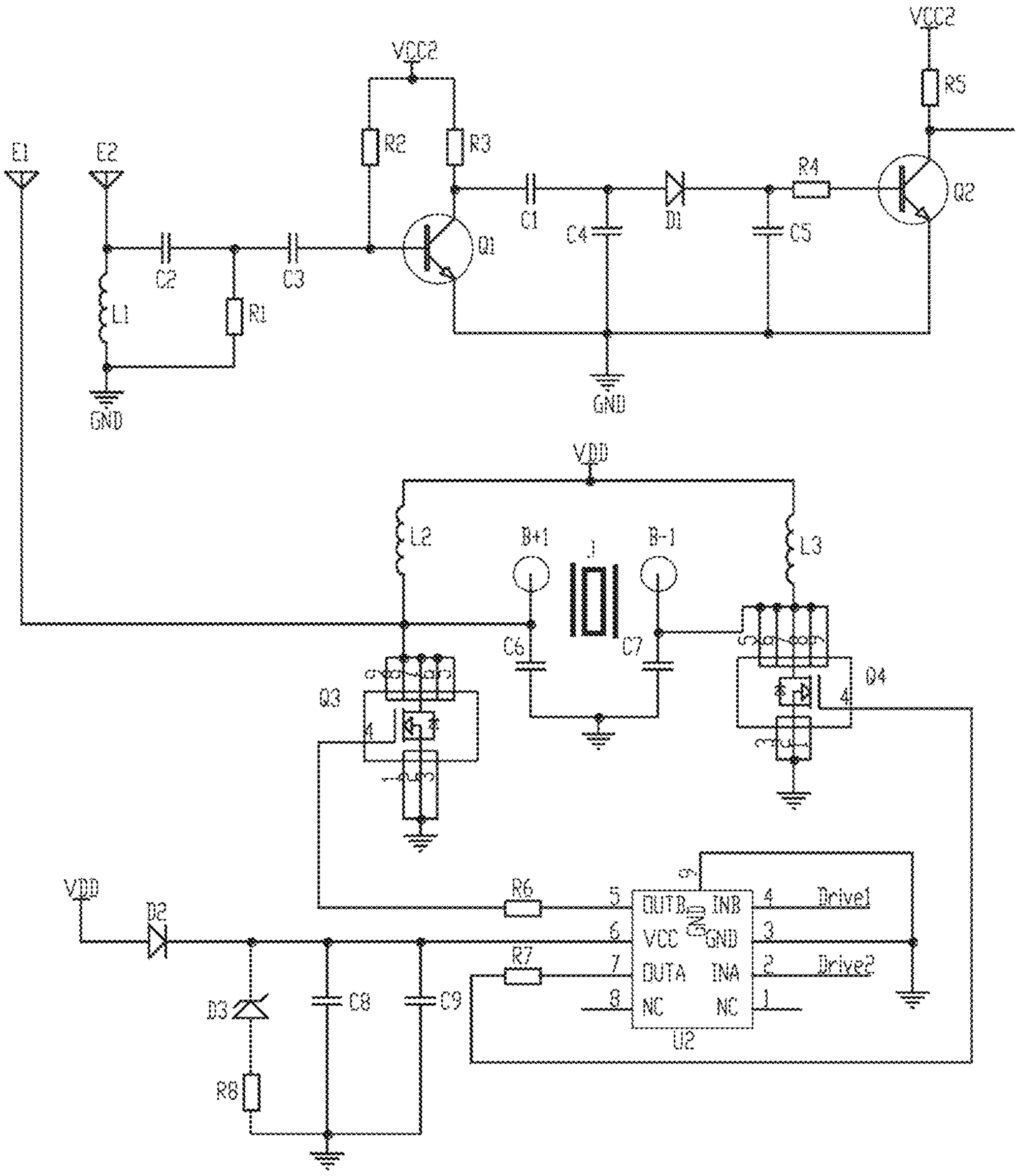
FIG. 11 is a circuit diagram of Embodiment 3.

As shown in FIG. 10 and FIG. 11, a circuit for an ultrasonic electronic cigarette comprises an ultrasonic atomization sheet J and a control circuit 1, a first output end of the control circuit 1 is electrically connected to a first end of the ultrasonic atomization sheet J through a first drive oscillation circuit 2, a second output end of the control circuit 1 is electrically connected to a second end of the ultrasonic atomization sheet J through a second drive oscillation circuit 3, the circuit for the ultrasonic electronic cigarette further comprises a first antenna E1 electrically connected to one end of the ultrasonic atomization sheet J for detecting high-frequency electromagnetic wave signals transmitted when the ultrasonic atomization sheet J oscillates, and an antenna receiving circuit 13 for receiving the signals transmitted by the first antenna E1, and the antenna receiving circuit 13 is electrically connected to an input end of the control circuit 1 through a filter amplifier circuit 7 and a filter shaping and square wave conversion circuit 6 in sequence.

The frequency tracking circuit further comprises a power circuit 5, and the power circuit 5 is composed of a single lithium battery, a charge-discharge protection circuit and a boost circuit, and provides operating power to each circuit module. The charge-discharge protection circuit has overcharge-overvoltage protection functions to prevent overcurrent and short circuit of the back-end circuit. The boost circuit boosts the single lithium battery to 16 V, and provides power of about 30 W for the back-end drive oscillation circuits.

The control circuit 1 is used to control on-off of each circuit module and output PWM signals. The control circuit 1 controls the indication of LED lamps and the on-off of the MOS transistors through a 51 core single chip microcomputer to realize low power consumption and safety protection of the entire circuit board, and detect the voltage and current changes of the ultrasonic atomization sheet J in real time so as to prevent dry burning and overload of the ultrasonic atomization sheet J, and provide PWM signals and subjected to frequency tracking for the back-end drive circuits 1.

The drive oscillation circuits amplify the PWM signals provided by the control circuit 1 through drive chips, and drive the inductors and capacitors in the back-end oscillation circuits to resonate, so that the ultrasonic atomization sheet J performs full-wave oscillation to achieve the optimal atomizing effect.

The antenna receiving circuit 13 comprises a second antenna E2 and a first inductor L1, a filter amplifier and the second antenna E2 are both electrically connected to a first end of the first inductor L1, and a second end of the first inductor L1 is grounded. The filter amplifier circuit 7 comprises a first capacitor C1, a second capacitor C2, a third capacitor C3, a first resistor R1, a second resistor R2, a third resistor R3, and a first NPN triode Q1; one end of the second capacitor C2 and one end of the first resistor R1 are both electrically connected to one end of the third capacitor C3, the other end of the second capacitor C2 is electrically connected to the first end of the first inductor L1, the other end of the first resistor R1 is grounded, the other end of the third capacitor C3 and one end of the second resistor R2 are electrically connected to a base of the first NPN triode Q1, the other end of the second resistor R2 and one end of the third resistor R3 are electrically connected to a positive pole of a power supply, the other end of the third resistor R3 and one end of the first capacitor C1 are electrically connected to a collector of the first NPN triode Q1, the other end of the first capacitor C1 is electrically connected to the filter shaping and square wave conversion circuit 6, and an emitter of the first NPN triode Q1 is grounded.

The filter shaping and square wave conversion circuit 6 comprises a fourth capacitor C4, a fifth capacitor C5, a first diode D1, a fourth resistor R4, a fifth resistor R5, and a second NPN triode Q2; one end of the fourth capacitor C4 and one end of the first capacitor C1 are both electrically connected to an anode of the first diode D1, one end of the fourth resistor R4 and one end of the fifth capacitor C5 are both electrically connected to a cathode of the first diode D1; the other end of the fourth resistor R4 is electrically connected to a base of the second NPN triode Q2; the other end of the fourth capacitor C4, the other end of the fifth capacitor C5 and an emitter of the second NPN triode Q2 are all grounded; one end of the fifth resistor R5 is electrically connected to the positive pole of the power supply, and the input end of the control circuit 1 and the other end of the fifth resistor R5 are both electrically connected to a collector of the second NPN triode Q2.

The first drive oscillation circuit 2 comprises an amplifier U2, a sixth resistor R6, a first MOS transistor Q3, a second inductor L2, and a sixth capacitor C6; the first output end of the control circuit 1 is electrically connected to a first input end of the amplifier U2; a first output end of the amplifier U2 is electrically connected to a gate of the first MOS transistor Q3 through the sixth resistor R6; a source of the first MOS transistor Q3 is grounded; a drain of the first MOS transistor Q3, one end of the second inductor L2 and one end of the sixth capacitor C6 are all electrically connected to the first end of the ultrasonic atomization sheet J, the other end of the second inductor L2 is electrically connected to the positive pole of the power supply, and the other end of the sixth capacitor C6 is grounded.

The second drive oscillation circuit 3 comprises an amplifier U2, a seventh resistor R7, a second MOS transistor Q4, a third inductor L3, and a seventh capacitor C1; the second output end of the control circuit 1 is electrically connected to a second input end of the amplifier U2; a second output end of the amplifier U2 is electrically connected to a gate of the second MOS transistor Q4 through the seventh resistor R7; a source of the second MOS transistor Q4 is grounded; a drain of the second MOS transistor Q4, one end of the third inductor L3 and one end of the seventh capacitor C7 are all electrically connected to the second end of the ultrasonic atomization sheet J; the other end of the third inductor L3 is electrically connected to the positive pole of the power supply, and the other end of the seventh capacitor C7 is grounded.

The frequency tracking circuit further comprises an eighth capacitor C8, a ninth capacitor C9, an eighth resistor R8, a second diode D2, and a third diode D3; a cathode of the second diode D2, a cathode of the third diode, one end of the eighth capacitor C8, and one end of the ninth capacitor C9 are all electrically connected to a power end of the amplifier U2, the other end of the second diode D2 is electrically connected to the positive pole of the power supply, the other end of the eighth capacitor C8 and the other end of the ninth capacitor C9 are both grounded, and an anode of the third diode D3 is grounded through the eighth resistor R8.

The ultrasonic atomization sheet J is a piezoelectric ceramic atomization sheet, and is suitable for a piezoelectric ceramic atomization sheet and a component or circuit similar to the piezoelectric ceramic structure.

Specifically, the amplifier U2 and the resistors and capacitors at the front end constitute the entire drive circuit, which is driven by a high voltage, so that the back-end MOS transistors can be completely turned on to oscillate, and make the oscillation effect of the entire oscillation circuit to be optimized. The first antenna E1 is used to transmit high-frequency oscillation signals at one end of the ultrasonic atomization sheet J; second antenna E2 and the first inductor L1 constitute the antenna receiving circuit 13. The second capacitor C2 and the first resistor R1 constitute a high frequency band-pass filter for filter out low frequency and other harmonic interference. The third capacitor C3, the second resistor R2, the third resistor R3, the first capacitor C1, and the first NPN triode Q1 constitute a common-emitter high-frequency amplifier for amplify the received high-frequency signals, then the amplified signals are filtered and shaped by the fourth capacitor C4, the first diode D1 and the fifth capacitor C5 to form half waves with same frequency that can drive the triodes, then the half waves pass through the fifth resistor R5, the fourth resistor R4 and the second NPN triode Q2, and finally converted into square waves that can be identified by the single chip microcomputer with the same frequency as the ultrasonic atomization sheet J. By detecting the resonant frequency of the ultrasonic atomization sheet J, the oscillation frequency is adjusted in time, so that the oscillation of the entire circuit is always synchronized with the frequency of the ultrasonic atomization sheet J, and the optimal atomizing effect and the maximum amount of smoke are achieved.

Embodiment 4

Figure 12:
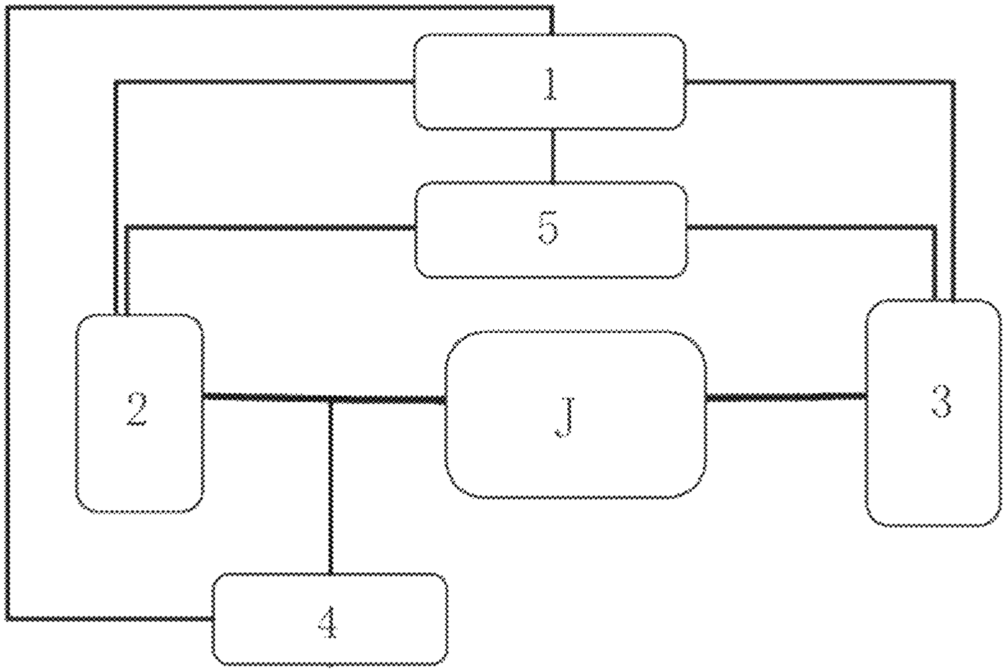
FIG. 12 is a structural schematic diagram of blocks of Embodiment 4 according to the present invention.
Figure 13:
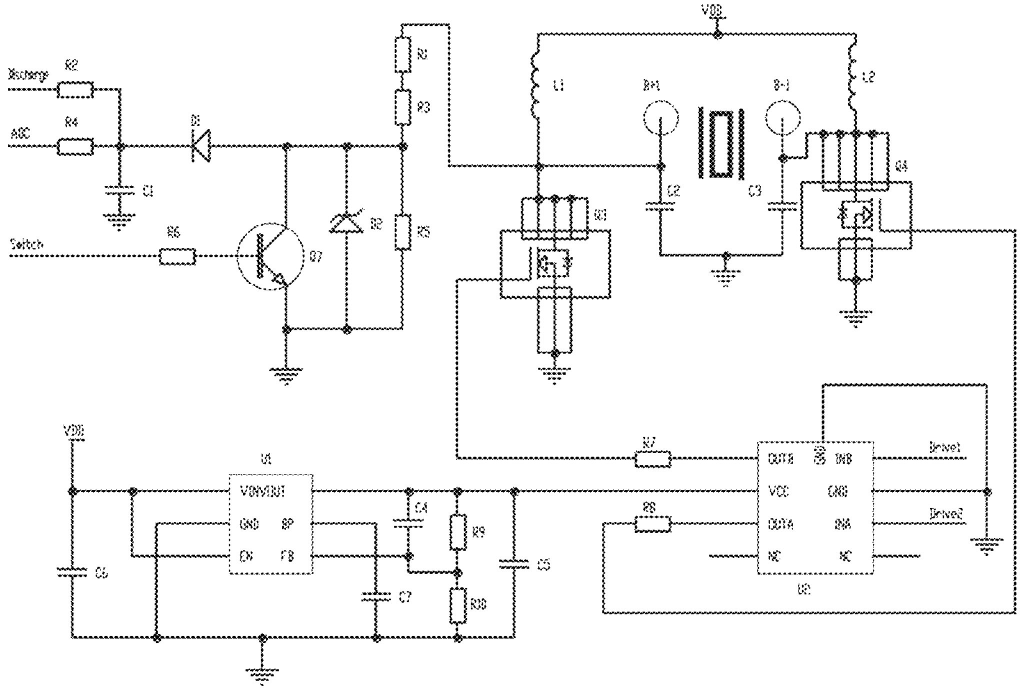
FIG. 13 is a circuit diagram of Embodiment 4.

As shown in FIG. 12 and FIG. 13, a circuit for an ultrasonic electronic cigarette comprises an ultrasonic atomization sheet J and a control circuit 1, a first output end of the control circuit 1 is electrically connected to a first end of the ultrasonic atomization sheet J through a first drive oscillation circuit 2, a second output end of the control circuit 1 is electrically connected to a second end of the ultrasonic atomization sheet J through a second drive oscillation circuit 3, the circuit for the ultrasonic electronic cigarette further comprises a power detection circuit 4, a detection end of the power detection circuit 4 is electrically connected to one end of the ultrasonic atomization sheet J, and an output end of the power detection circuit 4 is electrically connected to an input end of the control circuit 1.

The power detection circuit 4 comprises a first resistor R1, a second resistor R2, a third resistor R3, a fourth resistor R4, a fifth resistor R5, a sixth resistor R6, a first diode D1, a second diode D2, a first capacitor C1 and a third NPN triode Q7; one end of the ultrasonic atomization sheet J is connected to the ground through the first resistor R1, the third resistor R3 and the fifth resistor R5 in sequence; an anode of the first diode D1, a collector of the third NPN triode Q7, and a cathode of the second diode D2 are all connected between the third resistor R3 and the fifth resistor R5; a cathode of the first diode D1 is grounded through the first capacitor C1; an emitter of the third NPN triode Q7 and an anode of the second diode D2 are both grounded; one end of the second resistor R2 is connected to a third output end of the control circuit 1; one end of the fourth resistor R4 is connected to the input end of the control circuit 1; one end of the sixth resistor R6 is connected to a fourth output end of the control circuit 1; the other end of the second resistor R2 and the other end of the fourth resistor R4 are both grounded through the first capacitor C1, and the other end of the sixth resistor R6 is connected to a base of the third NPN triode Q7.

The first drive oscillation circuit 2 comprises an amplifier U2, a seventh resistor R7, a first MOS transistor Q3, a first inductor L1, and a second capacitor C2; the first output end of the control circuit 1 is electrically connected to a first input end of the amplifier U2, a first output end of the amplifier U2 is electrically connected to a gate of the first MOS transistor Q3 through the seventh resistor R7, and a source of the first MOS transistor Q3 is grounded; a drain of the first MOS transistor Q3, one end of the first inductor L1, and one end of the second capacitor C2 are all electrically connected to the first end of the ultrasonic atomization sheet J, the other end of the first inductor L1 is electrically connected to a positive pole of a power supply, and the other end of the second capacitor C2 is grounded.

The second drive oscillation circuit 3 comprises an amplifier U2, an eighth resistor R8, a second MOS transistor Q4, a second inductor L2, and a third capacitor C3; the second output end of the control circuit 1 is electrically connected to a second input end of the amplifier U2, a second output end of the amplifier U2 is electrically connected to a gate of the second MOS transistor Q4 through the eighth resistor R8, and a source of the second MOS transistor Q4 is grounded; a drain of the second MOS transistor Q4, one end of the second inductor L2, and one end of the third capacitor C3 are all electrically connected to the second end of the ultrasonic atomization sheet J, the other end of the second inductor L2 is electrically connected to the positive pole of the power supply, and the other end of the third capacitor C3 is grounded.

The frequency tracking circuit further comprises a power circuit 5, and the power circuit 5 comprises a boost chip U1, a fourth capacitor C4, a fifth capacitor C5, a sixth capacitor C6, a seventh capacitor C7, a ninth resistor R9, and a tenth resistor R10; one end of the sixth capacitor C6, and an input end and an enable end of the boost chip U1 are all electrically connected to the positive pole of the power supply; one end of the fourth capacitor C4, one end of the ninth resistor R9, and one end of the fifth capacitor C5 are all electrically connected to an output end of the boost chip U1; the output end of the boost chip U1 is electrically connected to the first drive oscillation circuit 2 and the second drive oscillation circuit 3; a bypass end of the boost chip U1 is grounded through the seventh capacitor C7, and the other end of the ninth resistor R9 is grounded through the tenth resistor R10; the other end of the fifth capacitor C5, the other end of the sixth capacitor C6, and a ground end of the boost chip U1 are all grounded; the other end of the fourth capacitor C4 is electrically connected to a feedback end of the boost chip U1 and connected between the ninth resistor R9 and the tenth resistor R10 as well.

The ultrasonic atomization sheet J is a piezoelectric ceramic atomization sheet, and is suitable for a piezoelectric ceramic atomization sheet and a component or circuit similar to the piezoelectric ceramic structure.

In the fourth embodiment, the control circuit 1 controls the indication of LED lamps and the on-off of the MOS transistors through a 51 core single chip microcomputer to realize low power consumption and safety protection of the entire circuit board, and detect the voltage and current changes of the ultrasonic atomization sheet J in real time to prevent dry burning and overload of the ultrasonic atomization sheet J, as well as provide PWM signals for the back-end drive circuits and subject to frequency tracking in real time by the power detection circuit 4.

The drive circuits amplify two-path PWM signals provided by the control circuit 1 through the drive chips, and drive the inductors and capacitors in the bilateral oscillation circuits to resonate with the ultrasonic atomization sheet J, so that the ultrasonic atomization sheet J performs full-wave oscillation to achieve the optimal atomizing effect.

The power circuit 5 is composed of a single lithium battery, a charge-discharge protection circuit and a boost circuit, has an overcharge-overvoltage protection function, and can prevent overcurrent and short circuit of the back-end circuit. The single lithium battery boost module boosts the single lithium battery to provide power of about 30 W to the back-end high-frequency separately-excited bilateral oscillation circuit.

In the power detection circuit 4, the amplitude of the ultrasonic atomization sheet J at the time of oscillation is first collected by three voltage dividing resistors, i.e., the first resistor R1, the third resistor R3, and the fifth resistor R5, and the second diode D2 is a voltage regulator tube and can prevent pins of the single chip microcomputer from being burnt out due to over-high collection voltage if the collection resistors fail. The principle of power detection: first, the voltage of the Switch signal at the fourth output end of the control circuit 1 is pulled down, the third NPN triode Q7 is turned off, at this time, the first capacitor C1 is charged by voltages divided by the collection resistors, and the first diode D1 prevents energy release during charging; after the collection resistors fixedly collect dozens of oscillation period of the ultrasonic atomization sheet J, the charging voltage of the first capacitor C1 reaches a certain value, at this time, the third NPN triode Q7 is turned on to short-circuit the fifth resistor R5, so that the collection voltage is zero, and the charging is stopped; in the meantime, the voltage is detected at the ADC port of the single chip microcomputer, and the value of the detected capacitor voltage is converted into the power of the ultrasonic atomization sheet J; after the voltage detection is completed at the ADC port, the voltage at the Discharge port of the single chip microcomputer is pulled down, the charged power of the first capacitor C1 is completely released to make preparation for next power detection period, and the oscillation power of the atomization sheet is detected cyclically in the same way, and the frequency of the oscillation circuit is adjusted at the same time; when the power of the ultrasonic atomization sheet J is maximum, the oscillation frequency is closest to the frequency of the ultrasonic atomization sheet J itself, and the amount of smoke of the electronic cigarette is also maximum. The interference of other components in the circuit can be eliminated through power detection, and fast and accurate frequency tracking of the ultrasonic atomization sheet J can be realized more accurately and reliably, thereby ensuring that the amount of smoke of the electronic cigarette is always maximum, and improving the product performance.

The embodiments of the present invention are described above with reference to the drawings, but the present invention is not limited to the specific embodiments. The specific embodiments described above are merely illustrative but not restrictive. Many forms may also be made by those of ordinary skill in the art under the enlightenment of the present invention without departing from the purpose of the present invention and the scope of the claims, and these forms fall into the scope of the present invention.

The invention claimed is:

1. A circuit for an ultrasonic electronic cigarette, comprising:

an ultrasonic atomization sheet (J);

a control circuit (1);

a first drive oscillation circuit (2);

a power circuit (5), wherein the control circuit (1) is electrically connected to a first end of the ultrasonic atomization sheet (J) through the first drive oscillation circuit (2), wherein the control circuit (1) and the first drive oscillation circuit (2) are electrically connected to the power circuit (5); and a second drive oscillation circuit (3), wherein the control circuit (1) is electrically connected to a second end of the ultrasonic atomization sheet (J) through the second drive oscillation circuit (3), and wherein the second drive oscillation circuit (3) is electrically connected to the power circuit (5).

2. The circuit for the ultrasonic electronic cigarette according to claim 1, further comprising: a detection circuit for detecting the operating state of the ultrasonic atomization sheet (J), wherein an output end of the detection circuit is electrically connected to the control circuit (1), wherein a detection end of the detection circuit is connected between the ultrasonic atomization sheet (J) and the first drive oscillation circuit (2), or the detection end of the detection circuit is connected between the ultrasonic atomization sheet (J) and the second drive oscillation circuit (3).

3. The circuit for the ultrasonic electronic cigarette according to claim 2, wherein the first drive oscillation circuit (2) comprises a first drive circuit (201) and a first oscillation circuit (202), and wherein the second drive oscillation circuit (3) comprises a second drive circuit (301) and a second oscillation circuit (302); wherein the control circuit (1) is electrically connected to the first end of the ultrasonic atomization sheet (J) through the first drive circuit (201) and the first oscillation circuit (202) in sequence, wherein the control circuit (1), the first drive circuit (201), and the first oscillation circuit (202) are all electrically connected to the power circuit (5), wherein the control circuit (1) is electrically connected to the second end of the ultrasonic atomization sheet (J) through the second drive circuit (301) and the second oscillation circuit (302) in sequence, and wherein the second drive circuit (301) and the second oscillation circuit (302) are both electrically connected to the power circuit (5).

4. The circuit for the ultrasonic electronic cigarette according to claim 3, wherein the first oscillation circuit (202) comprises a first MOS transistor (Q3), a first inductor (L1), and a first capacitor (C1), wherein a gate of the first MOS transistor (Q3) is connected to an output end of the first drive circuit (201), wherein a source of the first MOS transistor (Q3) is grounded, wherein the first inductor (L1) is connected between the power circuit (5) and a drain of the first MOS transistor (Q3), wherein the first capacitor (C1) is connected between the drain of the first MOS transistor (Q3) and the ground, and wherein the drain of the first MOS transistor (Q3) is electrically connected to the first end of the ultrasonic atomization sheet (J).

5. The circuit for the ultrasonic electronic cigarette according to claim 3, wherein the second oscillation circuit (302) comprises a second MOS transistor (Q4), a second inductor (L2), and a second capacitor (C2), wherein a gate of the second MOS transistor (Q4) is connected to an output end of the second drive circuit (301), wherein a source of the second MOS transistor (Q4) is grounded, wherein the second inductor (L2) is connected between the power circuit (5) and a drain of the second MOS transistor (Q4), wherein the second capacitor (C2) is connected between the drain of the second MOS transistor (Q4) and the ground, and wherein the drain of the second MOS transistor (Q4) is electrically connected to the second end of the ultrasonic atomization sheet (J).

6. The circuit for the ultrasonic electronic cigarette according to claim 3, wherein the first drive circuit (201) and the second drive circuit (301) respectively output drive voltages with opposite phases and equal frequency to the ultrasonic atomization sheet (J) at the same moment under the control of the control circuit (1).

7. The circuit for the ultrasonic electronic cigarette according to claim 4, wherein the first drive circuit (201) and the second drive circuit (301) respectively output drive voltages with opposite phases and equal frequency to the ultrasonic atomization sheet (J) at the same moment under the control of the control circuit (1).

8. The circuit for the ultrasonic electronic cigarette according to claim 5, wherein the first drive circuit (201) and the second drive circuit (301) respectively output drive voltages with opposite phases and equal frequency to the ultrasonic atomization sheet (J) at the same moment under the control of the control circuit (1).

9. The circuit for the ultrasonic electronic cigarette according to claim 3, wherein the power circuit (5) comprises a single lithium battery (8), a charge-discharge circuit (9), and boost circuits; wherein the boost circuits comprise a first boost circuit (10) and a second boost circuit (11), wherein the single lithium battery (8) is electrically connected to the first boost circuit (10) and the second boost circuit (11) respectively through the charge-discharge circuit (9); wherein the control circuit (1), the first drive circuit (201), and the second drive circuit (301) are all electrically connected to an output end of the first boost circuit (10); and wherein the first oscillation circuit (202) and the second oscillation circuit (302) are both electrically connected to an output end of the second boost circuit (11).

10. The circuit for the ultrasonic electronic cigarette according to claim 4, wherein the power circuit (5) comprises a single lithium battery (8), a charge-discharge circuit (9) and boost circuits; wherein the boost circuits comprise a first boost circuit (10) and a second boost circuit (11), wherein the single lithium battery (8) is electrically connected to the first boost circuit (10) and the second boost circuit (11) respectively through the charge-discharge circuit (9); wherein the control circuit (1), the first drive circuit (201), and the second drive circuit (301) are all electrically connected to an output end of the first boost circuit (10); and wherein the first oscillation circuit (202) and the second oscillation circuit (302) are both electrically connected to an output end of the second boost circuit (11).

11. The circuit for the ultrasonic electronic cigarette according to claim 5, wherein the power circuit (5) comprises a single lithium battery (8), a charge-discharge circuit (9) and boost circuits; wherein the boost circuits comprise a first boost circuit (10) and a second boost circuit (11), wherein the single lithium battery (8) is electrically connected to the first boost circuit (10) and the second boost circuit (11) respectively through the charge-discharge circuit (9); wherein the control circuit (1), the first drive circuit (201), and the second drive circuit (301) are all electrically connected to an output end of the first boost circuit (10); and wherein the first oscillation circuit (202) and the second oscillation circuit (302) are both electrically connected to an output end of the second boost circuit (11).

12. The circuit for the ultrasonic electronic cigarette according to claim 2, wherein the detection circuit is a voltage-current detection circuit (12), and wherein an output end of the voltage-current detection circuit (12) is electrically connected to the control circuit (1); wherein the voltage-current detection circuit (12) is connected between the ultrasonic atomization sheet (J) and the first oscillation circuit (202), or the voltage and current detection circuit (12) is connected between the ultrasonic atomization sheet (J) and the second oscillation circuit (302).

13. The circuit for the ultrasonic electronic cigarette according to claim 3, wherein the detection circuit is a voltage-current detection circuit (12), wherein an output end of the voltage-current detection circuit (12) is electrically connected to the control circuit (1); and wherein the voltage-current detection circuit (12) is connected between the ultrasonic atomization sheet (J) and the first oscillation circuit (202), or the voltage and current detection circuit (12) is connected between the ultrasonic atomization sheet (J) and the second oscillation circuit (302).

14. The circuit for the ultrasonic electronic cigarette according to claim 4, wherein the detection circuit is a voltage-current detection circuit (12), wherein an output end of the voltage-current detection circuit (12) is electrically connected to the control circuit (1); and wherein the voltage-current detection circuit (12) is connected between the ultrasonic atomization sheet (J) and the first oscillation circuit (202), or the voltage and current detection circuit (12) is connected between the ultrasonic atomization sheet (J) and the second oscillation circuit (302).

15. The circuit for the ultrasonic electronic cigarette according to claim 5, wherein the detection circuit is a voltage-current detection circuit (12), wherein an output end of the voltage-current detection circuit (12) is electrically connected to the control circuit (1); and wherein the voltage-current detection circuit (12) is connected between the ultrasonic atomization sheet (J) and the first oscillation circuit (202), or the voltage and current detection circuit (12) is connected between the ultrasonic atomization sheet (J) and the second oscillation circuit (302).

16. The circuit for the ultrasonic electronic cigarette according to claim 2, wherein the detection circuit comprises a first antenna (E1) electrically connected to one end of the ultrasonic atomization sheet (J) for detecting high-frequency electromagnetic wave signals transmitted when the ultrasonic atomization sheet (J) oscillates, and an antenna receiving circuit (13) for receiving the signals transmitted by the first antenna (E1), and wherein the antenna receiving circuit (13) is electrically connected to an input end of the control circuit (1) through a filter amplifier circuit (7) and a filter shaping and square wave conversion circuit (6) in sequence.

17. The circuit for the ultrasonic electronic cigarette according to claim 16, wherein the antenna receiving circuit (13) comprises a second antenna (E2) and a first inductor (L1), wherein a filter amplifier and the second antenna (E2) are both electrically connected to a first end of the first inductor (L1), and wherein a second end of the first inductor (L1) is grounded.

18. The circuit for the ultrasonic electronic cigarette according to claim 2, wherein the detection circuit is a power detection circuit (4), wherein a detection end of the power detection circuit (4) is electrically connected to one end of the ultrasonic atomization sheet (J), and wherein an output end of the power detection circuit (4) is electrically connected to the input end of the control circuit (1).

19. An ultrasonic electronic cigarette, comprising the circuit for the ultrasonic electronic cigarette according to claim 1.

20. The ultrasonic electronic cigarette according to claim 19, wherein the circuit for the ultrasonic electronic cigarette further comprising a detection circuit for detecting the operating state of the ultrasonic atomization sheet (J); wherein an output end of the detection circuit is electrically connected to the control circuit (1), and wherein a detection end of the detection circuit is connected between the ultrasonic atomization sheet (J) and the first drive oscillation circuit (2), or the detection end of the detection circuit is connected between the ultrasonic atomization sheet (J) and the second drive oscillation circuit (3);

wherein the detection circuit comprises a first antenna (E1) electrically connected to one end of the ultrasonic atomization sheet (J) for detecting high-frequency electromagnetic wave signals transmitted when the ultrasonic atomization sheet (J) oscillates, and an antenna receiving circuit (13) for receiving the signals transmitted by the first antenna (E1), and wherein the antenna receiving circuit (13) is electrically connected to an input end of the control circuit (1) through a filter amplifier circuit (7) and a filter shaping and square wave conversion circuit (6) in sequence.

* * * * *